United States Patent [19]
Kato

[11] Patent Number: 6,100,762
[45] Date of Patent: Aug. 8, 2000

[54] OPERATIONAL AMPLIFIER HAVING A WIDE INPUT/OUTPUT RANGE AND AN IMPROVED SLEW RATE

[75] Inventor: Fumihiko Kato, Yamagata, Japan

[73] Assignee: NEC Corportion, Japan

[21] Appl. No.: 09/146,181

[22] Filed: Sep. 3, 1998

[30] Foreign Application Priority Data

Sep. 4, 1997 [JP] Japan .................................. 9-239798

[51] Int. Cl.[7] ...................................................... H03F 3/45
[52] U.S. Cl. ........................... 330/255; 330/261; 330/292
[58] Field of Search .................................... 330/253, 255, 330/259, 261, 292

[56] References Cited

U.S. PATENT DOCUMENTS

| 5,670,910 | 9/1997 | Kato .......................................... 330/253 |
| 5,777,515 | 7/1998 | Kimura ................................. 330/292 X |

FOREIGN PATENT DOCUMENTS

| 62-230206 | 10/1987 | Japan . |
| 63-194404 | 8/1988 | Japan . |
| 4-250709 | 9/1992 | Japan . |
| 7-321570 | 12/1995 | Japan . |
| 8-204470 | 8/1996 | Japan . |

OTHER PUBLICATIONS

Japanese Office Action issued Feb. 15, 2000 in a related application and English translation of relevant portions.

*Primary Examiner*—Steven J. Mottola
*Attorney, Agent, or Firm*—Ostrolenk, Faber, Gerb & Soffen, LLP

[57] ABSTRACT

An operational amplifier having an input stage including a differential transistor pair and an output stage receiving an output of the input stage for outputting an output signal having a wide output range. The input stage includes a field effect transistor connected in parallel to a constant current source for the differential transistor pair and having a gate connected to receive a level-shifted signal of an output of the input stage, so that when the output signal of the output stage changes, the field effect transistor is turned on so as to supplying an additional bias current to the differential transistor pair in addition to a bias current supplied by the constant current source, so that the slew rate of the output signal of the output stage is elevated.

10 Claims, 8 Drawing Sheets

OPERATIONAL AMPLIFIER HAVING A WIDE INPUT/OUTPUT RANGE AND AN IMPROVED SLEW RATE

BACKGROUND OF THE INVENTION

1. Field of the invention

The present invention relates to an operational amplifier, and more specifically to an operational amplifier having a wide input/output range.

2. Description of related art

Prior art operational amplifiers include an operational amplifier having a wide input/output range and are generally capable of driving a large load. One example of this type operational amplifier was proposed by the inventor in U.S. Pat. No. 5,670,910, the content of which is incorporated by reference in its entirety into this application.

Now, the example of this type of operational amplifier will be described with reference to a circuit diagram as shown in FIG. 8.

As shown in FIG. 8, this type of operational amplifier can be generally divided into an input stage 10 connected to signal input terminals 1 and 2 for receiving and amplifying a signal between the signal input terminals 1 and 2 in a differential manner, and an output stage 20 for driving an output signal terminal 3 for outputting an amplified signal.

The input stage 10 includes:

a differential transistor pair composed of a pair of N-channel field effect transistors M1 and M2 having their sources connected to each other and their gates connected to the signal input terminals 2 and 1, respectively;

a first constant current source I1 connected between the common-connected sources of the N-channel field effect transistors M1 and M2 and a low potential power supply line 4;

a P-channel field effect transistor M3 having a gate and a drain connected in common to a drain of the N-channel field effect transistor M1 and a source connected to a high potential power supply line 5;

a P-channel field effect transistor M4 having a source connected to the high potential power supply line 5, a gate connected to the gate and the drain of the P-channel field effect transistor M3, and a drain connected to a drain of the N-channel field effect transistor M2;

another differential transistor pair composed of a pair of P-channel field effect transistors M5 and M6 having their sources connected to each other and their gates connected to the signal input terminals 1 and 2, respectively;

a second constant current source I2 connected between the common-connected sources of the P-channel field effect transistors M5 and M6 and the high potential power supply line 5;

an N-channel field effect transistor M7 having a gate and a drain connected to a drain of the P-channel field effect transistor M5 and a source connected to the low potential power supply line 4;

an N-channel field effect transistor M8 having a gate and a drain connected to a drain of the P-channel field effect transistor M6 and a source connected to the low potential power supply line 4;

an N-channel field effect transistor M9 connected to the N-channel field effect transistor M7 to form a current mirror circuit and having a drain connected to the drain of the P-channel field effect transistor M3; and an N-channel field effect transistor M10 connected to the N-channel field effect transistor M8 to form a current mirror circuit and having a drain connected to the drain of the P-channel field effect transistor M4.

On the other hand, the output stage 20 includes:

a P-channel field effect transistor M11 and a P-channel field effect transistor M13 having their sources connected to the high potential power supply line 5, and their gates connected in common to the drains of the P-channel field effect transistor M4, the N-channel field effect transistor M2 and the N-channel field effect transistor M10;

a third constant current source I3 connected between a drain of the P-channel field effect transistor M11 and the low potential power supply line 4;

a P-channel field effect transistor M12 having a source connected to the high potential power supply line 5, a gate connected to a connection node between the drain of the P-channel field effect transistor M11 and the third constant current source I3;

a fourth constant current source I4 connected between a drain of the P-channel field effect transistor M12 and the low potential power supply line 4; and an N-channel field effect transistor M14 having a source connected to the low potential power supply line 4 and a gate connected to a connection node between the drain of the P-channel field effect transistor M12 and the fourth constant current source I4, a drain of the P-channel field effect transistor M13 and a drain of the N-channel field effect transistor M14 being connected to the output signal terminal 3.

As seen from the above, in the above construction, the drain of the N-channel field effect transistor M2 constitutes an output of the input stage 10.

Next, an operation of the above mentioned prior art operational amplifier will be described.

This prior art operational amplifier includes the input stage having a wide input range, composed of the differential transistor pair formed of the N-channel field effect transistors M1 and M2 and the differential transistor pair formed of the N-channel field effect transistors M5 and M6, these differential transistor pairs being connected in parallel, and the drain of the N-channel field effect transistor M2 being connected to the output stage as the output of the input stage. In the output stage, the output of the input stage is connected to the gate of the P-channel field effect transistor M13 so as to change a gate voltage in accordance with a difference between signal voltages applied to the signal input terminals 1 and 2, and at the same time, the output of the input stage is level-shifted through the P-channel field effect transistor M11 and the P-channel field effect transistor M12, so that this level-shifted signal is applied to the gate of the N-channel field effect transistor M14 so as to simultaneously change the gate voltage of the N-channel field effect transistor M14. In accordance with the respective gate voltage changes of these field effect transistors M13 and M14, the potential of the output signal terminal 3 quickly elevates or drops.

For example, when the voltage applied to the signal input terminal is higher than that applied to the signal input terminal 2, the output of the input stage 10 supplied from the drain of the field effect transistor M2 of the differential transistor pair, becomes low, and therefore, the gate voltage of the P-channel field effect transistors M11 and M13 of the output stage 20 becomes low. At this time, a current flowing from the high potential power supply line 5 through the P-channel field effect transistor M13 to the output signal terminal 3 becomes very large. At the same time, the potential of the connection node between the drain of the P-channel field effect transistor M11 and the third constant current source I3, namely, the gate potential of the P-channel field effect transistor M12 becomes high. As a result, the potential of the connection node between the drain of the P-channel field effect transistor M12 and the fourth constant current source I4, namely, the level shifted signal applied to the gate of the N-channel field effect transistor M14 becomes low. Accordingly, a current flowing from the output signal terminal 3 through the N-channel field effect transistor M14 to the low potential power supply line 4, becomes very small.

Thus, since the current flowing through the P-channel field effect transistor M13 is large and the current flowing through the N-channel field effect transistor M14 is in a cutoff condition, the potential of the signal output terminal 3 can be caused to quickly elevate.

On the other hand, when the voltage applied to the signal input terminal 1 is lower than that applied to the signal input terminal 2, the output of the input stage 10 supplied from the drain of the field effect transistor M2 of the differential transistor pair, becomes high, and therefore, the gate voltage of the P-channel field effect transistors M11 and M13 of the output stage 20 becomes high. At this time, the current flowing from the high potential power supply line 5 through the P-channel field effect transistor M13 to the output signal terminal 3 becomes very small. At the same time, the potential of the connection node between the drain of the P-channel field effect transistor M11 and the third constant current source I3, namely, the gate potential of the P-channel field effect transistor M12 becomes low. As a result, the potential of the connection node between the drain of the P-channel field effect transistor M12 and the fourth constant current source I4, namely, the level shifted signal applied to the gate of the N-channel field effect transistor M14 becomes high. Accordingly, the current flowing from the output signal terminal 3 through the N-channel field effect transistor M14 to the low potential power supply line 4, becomes very large.

Thus, since the current flowing through the N-channel field effect transistor M14 is large and the current flowing through the P-channel field effect transistor M13 is in a cutoff condition, the potential of the signal output terminal 3 can be caused to quickly drop.

In this prior art operational amplifier, the potential of the signal output terminal 3 can change in a wide output range from a potential which is lower than the potential of the high potential power supply line 5 by the drain-source voltage of the P-channel field effect transistor M13, to a potential which is higher than the potential of the low potential power supply line 4 by the drain-source voltage of the N-channel field effect transistor M14.

In a balanced condition, an idling current flowing through the P-channel field effect transistor M13 and the N-channel field effect transistor M14, is determined by a size ratio between the P-channel field effect transistor M11 and the P-channel field effect transistor M13 and a current flowing through the constant current source I3. For example, assuming that the current flowing through the constant current source I3 is I ($\mu$A) and the size ratio of the P-channel field effect transistor M11 to the P-channel field effect transistor M13 is 1:2, the idling current flowing through the P-channel field effect transistor M13 and the N-channel field effect transistor M14 becomes 2I($\mu$A).

As mentioned above, the circuit shown in FIG. 8 realizes an operation amplifier having a wide input range and a wide output range and capable of quickening the elevation and the drop of the potential of the signal output terminal 3.

Here, a slew rate dV0/dt of the rising voltage and the falling voltage of this operational amplifier is one parameter indicating the performance of the operational amplifier, and is roughly expressed by an equation dV0/dt=K·Ii/C (where "K" is a proportional constant). If this value is large, the potential of the output signal terminal can be quickly elevated or dropped. Here, the variable "Ii" is a bias current supplied from the constant current source to the differential transistor pair of the input stage. The variable "C" is a phase compensating capacitance for preventing deterioration of the high frequency characteristics of the operational amplifier, which is preferably connected between the gate and the drain of the P-channel field effect transistor M13 as shown in FIG. 8.

As seen from the above equation, the slew rate of the operational amplifier greatly depends upon the bias current caused to flow in the input stage. Therefore, in order to enlarge the slew rate so as to quicken the rising and the falling of the output signal, it is required in the existing circuit construction to enlarge the bias current supplied to the differential transistor pair in the input stage, namely, respective values of the first constant current source I1 and the second constant current source I2 in the circuit shown in FIG. 8. In this case, however, the whole consumed current of the operational amplifier inevitably increases.

SUMMARY OF THE INVENTION

Accordingly, it is an object of the present invention to provide an operational amplifier which has overcome the above mentioned defect of the conventional one.

Another object of the present invention is to provide an operational amplifier having a wide output range and capable of outputting all output signal having a rising speed and a falling speed which is quicker than the prior art, without increasing a consumed current.

The above and other objects of the present invention are achieved in accordance with the present invention by an operational amplifier including:

an input stage having a differential transistor pair composed of a pair of transistors connected between a constant current source and two output nodes and having control electrodes connected to two signal input terminals, respectively, so that a signal applied between the two signal input terminals is amplified in a differential manner, and an output signal is obtained from a selected output node of the two output nodes;

an output stage having two output transistors of different conductivity types, connected in series between two power supply terminals, a connection node between the two output transistors being connected to an output signal terminal, and a level shift circuit receiving the output signal of the input stage for generating a level-shifted signal of the output signal of the input stage, the output signal of the input stage and the level-shifted signal being applied to control electrodes of the two output transistors, respectively, so that the two output transistors drives the output signal terminal in a push-pull manner, a capacitance between the selected output node of the input stage and the output signal terminal, the input stage including a first bias current supplementing means connected in parallel to the constant current source, for selectively supplying an additional bias current to the differential transistor pair in accordance with one of the output signal of the input stage and the level-shifted signal.

In a preferred embodiment, the input stage includes a second constant current source having a polarity opposite to that of the first named constant current source, two current mirror circuits having outputs connected to the two output nodes of the input stage, respectively, a second differential transistor pair composed of two transistors which are of the opposite conductivity type to that of the two transistors of the first named differential transistor pair and which are connected between respective inputs of the two current mirror circuits and the second constant current source, control electrodes of the two transistors of the second differential transistor pair being connected to the two signal input terminals, respectively, so that the signal applied between the two signal input terminals is amplified in a differential manner, and;

wherein a second bias current supplementing means is connected in parallel to the second constant current source, for selectively supplying an additional bias current to the second differential transistor pair in accordance with one of the output signal of the input stage and the level-shifted signal, independently of the first mentioned additional bias current supplied to the first mentioned differential transistor pair.

Preferably, each of the first bias current supplementing means and the second bias current supplementing means is deactivated when a potential of the signal output terminal is substantially equal to a potential of one of the power supply terminals.

The first bias current supplementing means and the second bias current supplementing means include transistors connected in parallel to the first named constant current source and the second constant current source, respectively, and having a control electrode connected to receive the corresponding one of the output signal of the input stage and the level-shifted signal.

Each of the first bias current supplementing means and the second bias current supplementing means further includes a current mirror circuit receiving a current changing in accordance with the corresponding one of the output signal of the input stage and the level-shifted signal, for supplying a second additional bias current in parallel to the first named constant current source or the second constant current source.

Specifically, in the output stage and in the bias current supplementing means, only transistors having a control electrode receiving the output signal of the input stage or the level-shifted signal, are all formed of a field effect transistor or a bipolar transistor.

The above and other objects, features and advantages of the present invention will be apparent from the following description of preferred embodiments of the invention with reference to the accompanying drawings.

DESCRIPTION OF THE PREFERRED EMBODIMENTS

Figure 1:
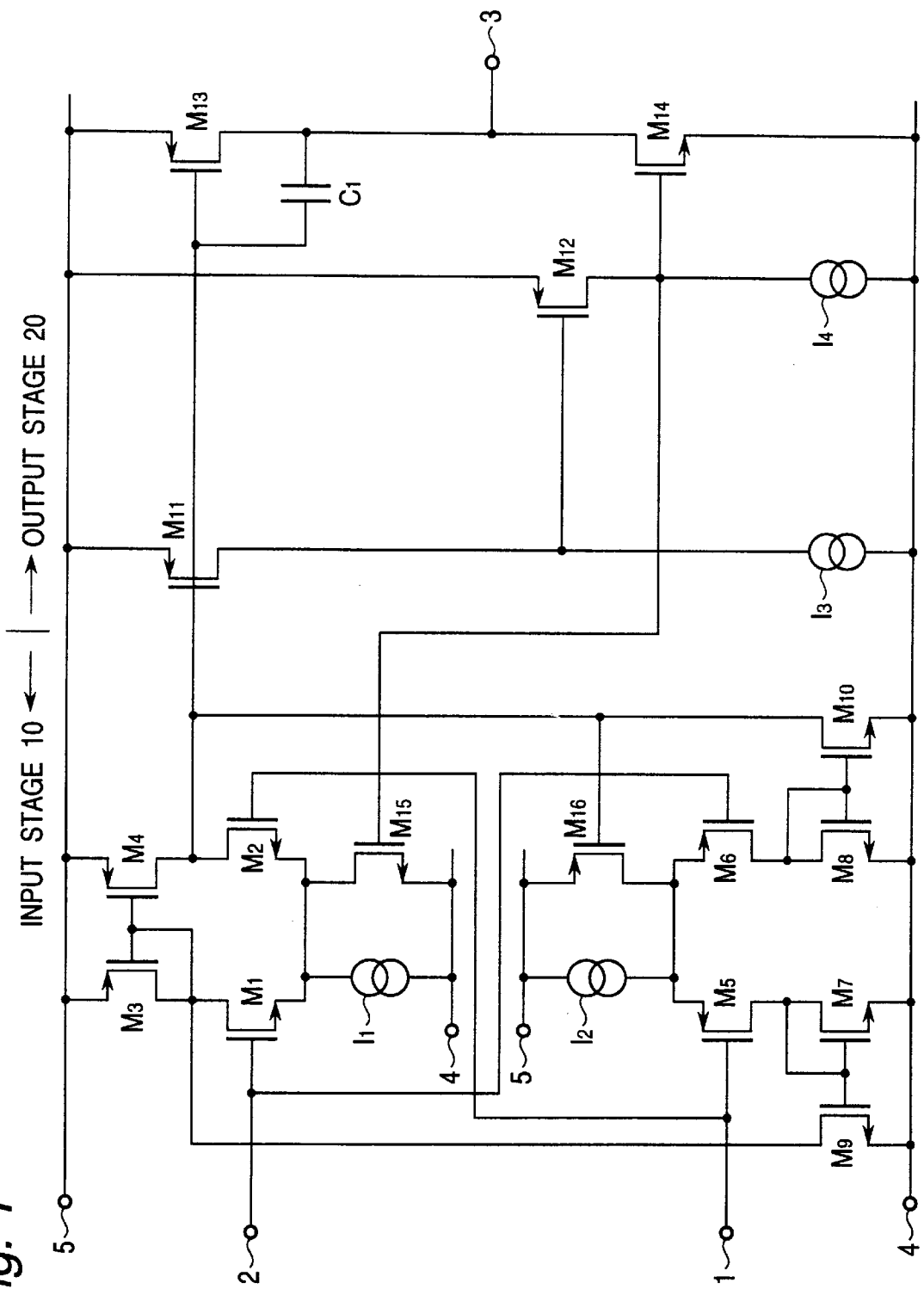
FIG. 1 is a circuit diagram of a first embodiment of the operational amplifier in accordance with the present invention.

Referring to FIG. 1, there is shown a circuit diagram of a first embodiment of the operational amplifier in accordance with the present invention. In FIG. 1, circuit elements corresponding to those shown in FIG. 8 are given the same reference numerals, and explanation of those elements will be omitted for simplification of description.

The first embodiment of the operational amplifier in accordance with the present invention shown in FIG. 1 is generally divided into an input stage 10 connected to signal input terminals 1 and 2 for receiving and amplifying a signal between the signal input terminals 1 and 2 in a differential manner, an output stage 20 driving an output signal terminal 3 for outputting a signal, and a capacitance C1 connected between an output node of the input stage 10 and the signal output terminal 3.

Figure 8:
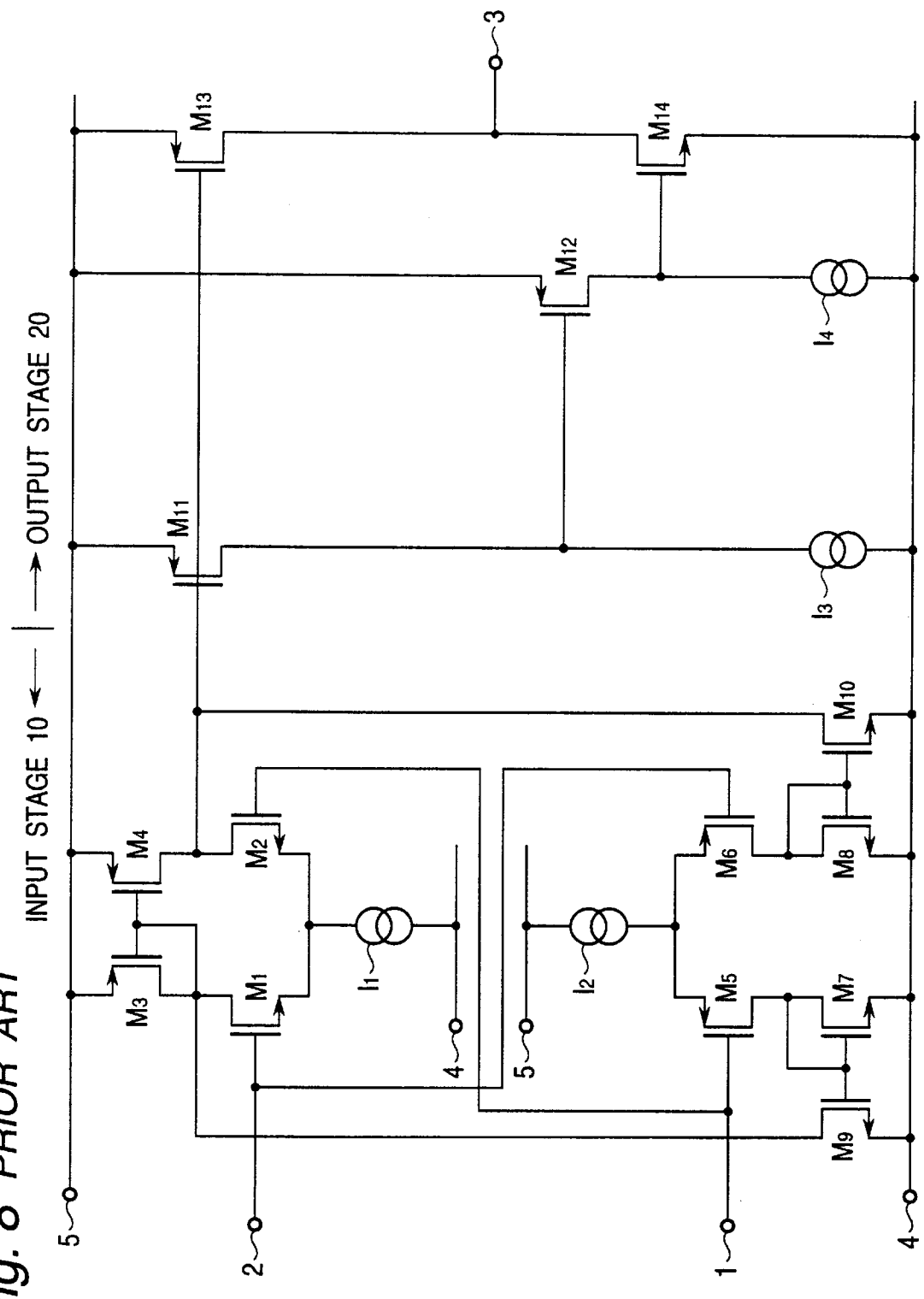
FIG. 8 is a circuit diagram of an example of the prior art operational amplifier.

As seen from comparison between FIG. 1 and FIG. 8, the first embodiment of the operational amplifier in accordance with the present invention is different from the prior art operational amplifier shown in FIG. 8 in that the capacitance C1 is added and an N-channel field effect transistor M15 and a P-channel field effect transistor M16 are added in the input stage 10. Since the construction other than the capacitance C1, the N-channel field effect transistor M15 and the P-channel field effect transistor M16 is the same as that of the operational amplifier shown in FIG. 8, explanation of the same construction portion will be omitted.

The N-channel field effect transistor M15 in the input stage 10 is connected in parallel to the first constant current source I1 and has a gate connected to the gate of the N-channel field effect transistor M14 in the output stage 20, so that an additional bias current is selectively supplied to the differential transistor pair formed of the N-channel field effect transistors M1 and M2, in parallel to a bias current supplied by the first constant current source I1, in accordance with the level-shifted signal applied to the gate of the N-channel field effect transistor M14 in the output stage 20.

The P-channel field effect transistor M16 in the input stage 10 is connected in parallel to the second constant current source I2 and has a gate connected to the gate of the P-channel field effect transistor M13 in the output stage 20, so that an additional bias current is selectively supplied to the differential transistor pair formed of the P-channel field effect transistors M5 and M6, in parallel to a bias current supplied by the second constant current source I2, in accordance with the output of the input stage 20 applied to the gate of the P-channel field effect transistor M13 in the output stage 20.

The capacitance C1 is a phase compensating capacitance for preventing deterioration of the high frequency characteristics of the operational amplifier. This capacitance C1 is connected between the output of the input stage 10 and the output signal terminal 3, and is preferably connected between the gate and the drain of the P-channel field effect transistor M13.

Now, an operation of the first embodiment of the operational amplifier in accordance with the present invention shown in FIG. 1 will be described.

Similarly to the prior art operational amplifier shown in FIG. 8, the first embodiment of the operational amplifier in accordance with the present invention shown in FIG. 1 includes the input stage having a wide input range, composed of the differential transistor pair formed of the N-channel field effect transistors M1 and M2 and the differential transistor pair formed of the N-channel field effect transistors M5 and M6, these differential transistor pairs being connected in parallel to receive the input signal in parallel to each other. In the output stage, the respective gate voltages of the field effect transistors M13 and M14 are simultaneously changed by the output of the input stage and the level-shifted signal of the output of the input stage in accordance with a difference between signal voltages applied to the signal input terminals 1 and 2. Thus, in accordance with the respective gate voltage changes of these field effect transistors M13 and M14, the potential of the output signal terminal 3 quickly elevates or drops.

This operation of the output stage 20 is the same as that of the output stage in the prior art operational amplifier shown in FIG. 8, and therefore, similarly to the prior art example, the output stage of this embodiment can have a wide output range. In addition, the idling current flowing through the P-channel field effect transistor M13 and the N-channel field effect transistor M14 in the balanced condition, is determined by a size ratio between the P-channel field effect transistor M11 and the P-channel field effect transistor M13 and a current flowing through the constant current source I3.

In this embodiment, when the voltage applied to the signal input terminal 1 is higher than that applied to the signal input terminal 2, the output of the input stage 10 supplied from the drain of the field effect transistor M2 of the differential transistor pair, becomes low, and therefore, the gate voltage of the P-channel field effect transistors M11 and M13 of the output stage 20 becomes low, and at the same time, the gate voltage of the P-channel field effect transistor M16 also becomes low. This means that a large current is caused to flow through the P-channel field effect transistor M16. Namely, the current flowing in the input stage becomes large only during a rising period in which the potential of the output signal terminal 3 rises. Accordingly, in the equation $dV0/dt=K \cdot Ii/C$, the variable "Ii" becomes large, so that a large slew rate can be obtained temporarily. On the other hand, in the balanced condition, since the gate voltages of the P-channel field effect transistors M11, M13 and M16 return to the original condition, the consumed current does not become large.

When the voltage applied to the signal input terminal 1 is lower than that applied to the signal input terminal 2, the output of the input stage 10 supplied from the drain of the field effect transistor M2 of the differential transistor pair becomes high; therefore, in the output stage 20, the gate voltage of the P-channel field effect transistors M11 and M13 of the output stage 20 becomes high, and the level-shifted signal applied to the gate of the N-channel field effect transistor M14 becomes high, and the gate voltage of the N-channel field effect transistor M15 also becomes high.

This means that a large current is caused to flow through the N-channel field effect transistor M15. Namely, the current flowing in the input stage becomes large only during a falling period in which the potential of the output signal terminal 3 falls. Accordingly, in the equation $dV0/dt=K \cdot Ii/C$, the variable "Ii" becomes large, so that a large slew rate can be obtained temporarily. On the other hand, in the balanced condition, since the gate voltages of the N-channel field effect transistors M14 and M15 return to the original condition, the consumed current does not become large.

As mentioned above, the first embodiment of the operational amplifier in accordance with the present invention can have a wide input range and a wide output range and can quicken the potential rising and the potential falling of the signal output terminal 3 in comparison with the prior art operational amplifier, without increasing the consumed current.

Figure 2:
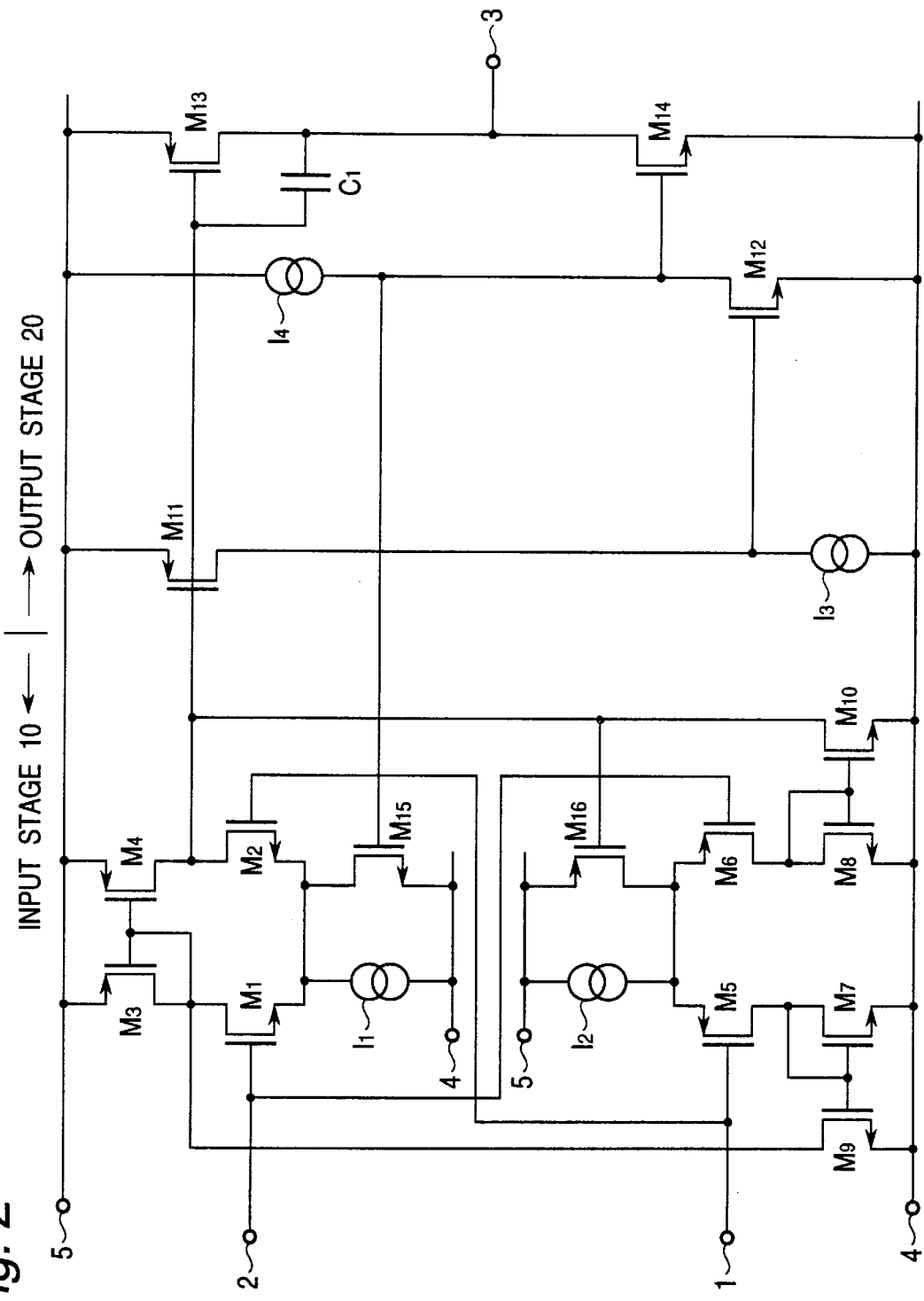
FIG. 2 is a circuit diagram of a second embodiment of the operational amplifier in accordance with the present invention.

Referring to FIG. 2, there is shown a circuit diagram of a second embodiment of the operational amplifier in accordance with the present invention. In FIG. 2, circuit elements corresponding to those shown in FIG. 1 are given the same reference numerals, and explanation will be omitted for simplification of description. In the following, a feature of the second embodiment differing from the first embodiment will be described.

As seen from comparison between FIG. 1 and FIG. 2, the second embodiment is different from the first embodiment only in that, in the output stage 20, the field effect transistor M12 is changed from the P-channel type to the N-channel type, and the fourth constant current source I4 is correspondingly modified to have a polarity opposite to that of the fourth constant current source I4 in the first embodiment. Namely, the fourth constant current source I4 of the second embodiment is of a current discharge type, and is connected between the high potential power supply line 5 and a drain of the N-channel field effect transistor M12.

A basic operation of the second embodiment thus constructed is similar to that of the first embodiment. Therefore, the second embodiment can have a wide input range and a wide output range and can quicken the potential rising and the potential falling of the signal output terminal 3 in comparison with the prior art operational amplifier, without increasing the consumed current.

Figure 3:
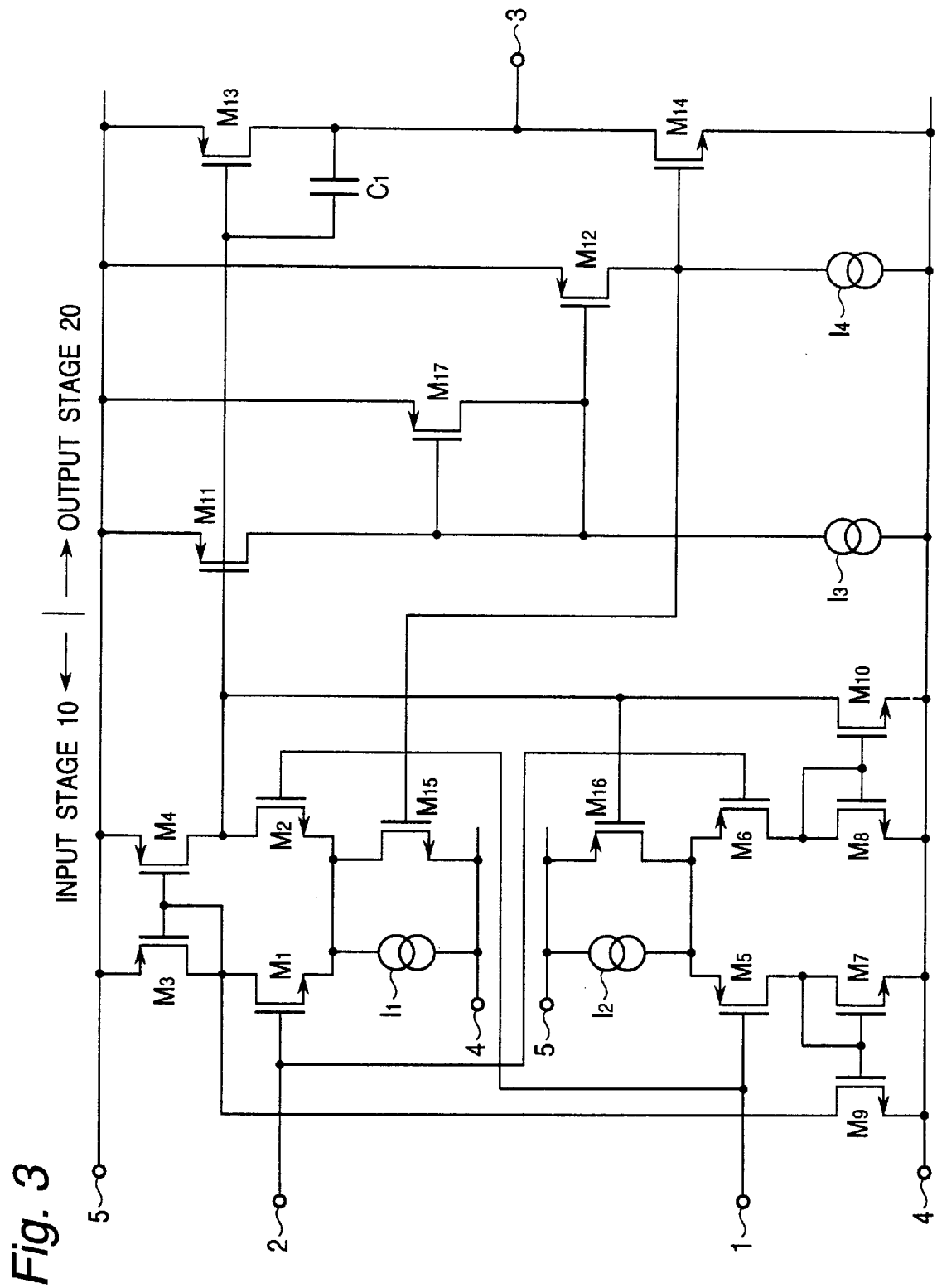
FIG. 3 is a circuit diagram of a third embodiment of the operational amplifier in accordance with the present invention.

Referring to FIG. 3, there is shown a circuit diagram of a third embodiment of the operational amplifier in accordance with the present invention. In FIG. 3, circuit elements corresponding to those shown in FIG. 1 are given the same reference numerals, and explanation of those elements will be omitted for simplification of description.

As seen from comparison between FIG. 1 and FIG. 3, the third embodiment is different from the first embodiment only in that, in the output stage 20, there is added a P-channel field effect transistor M17 having a gate and a drain connected in common to the drain of the P-channel field effect transistor M11 and a source connected to the high potential power supply line 5.

A basic operation of this third embodiment of the operational amplifier is similar to that of the first embodiment. In the third embodiment, however, since the gate terminal of the P-channel field effect transistor M12 is made to have a low impedance because of the added P-channel field effect transistor M17, the frequency characteristics are improved in a high frequency region.

Figure 4:
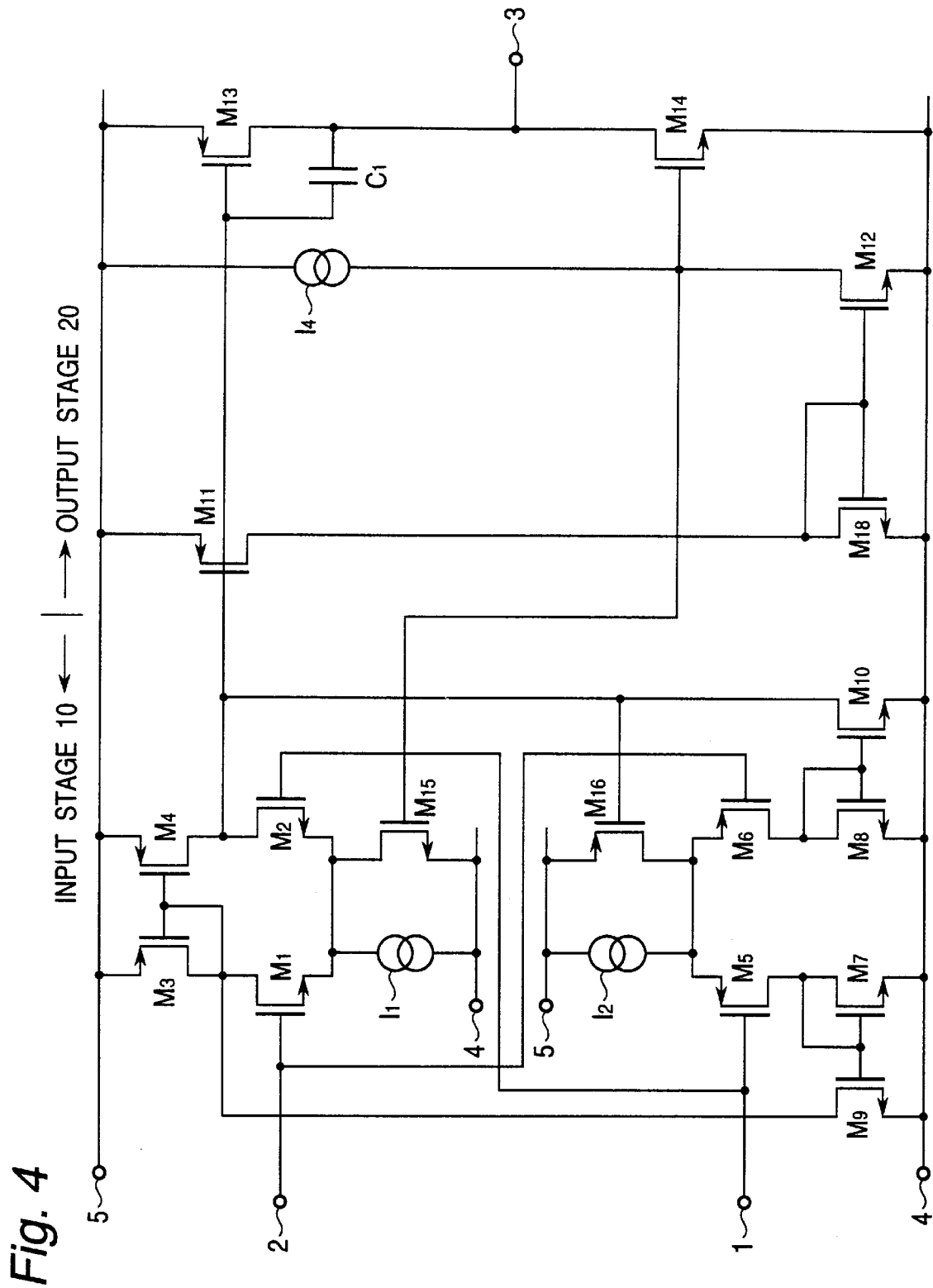
FIG. 4 is a circuit diagram of a fourth embodiment of the operational amplifier in accordance with the present invention.

Referring to FIG. 4, there is shown a circuit diagram of a fourth embodiment of the operational amplifier in accordance with the present invention. In FIG. 4, circuit elements corresponding to those shown in FIG. 2 are given the same reference numerals, and explanation of those elements will be omitted for simplification of description.

The fourth embodiment is characterized in that the third constant current source I3 in the second embodiment of the operational amplifier shown in FIG. 2 is replaced with an N-channel field effect transistor M18. This N-channel field effect transistor M18 has a source connected to the low potential power supply line 4 and a gate and a drain connected in common to the drain of the P-channel field effect transistor M11, so that a current mirror circuit is constituted of the N-channel field effect transistor M18 and the N-channel field effect transistor M12. Since the remainder of the circuit construction is the same as that of the second embodiment, explanation of such will be omitted for simplification of description.

Next, an operation of the fourth embodiment of the operational amplifier will be described briefly. In the output stage 20, the output of the input stage 10 is connected to the gate of the P-channel field effect transistor M13, so that the gate voltage of the P-channel field effect transistor M13 is changed in accordance with the difference between signal voltages applied to the signal input terminals 1 and 2. Simultaneously, the output of the input stage 10 is level-shifted by the P-channel field effect transistor M11 and the current mirror circuit formed of the N-channel field effect transistor M18 and the N-channel field effect transistor M12, so that the level-shifted signal is applied to the gate of the N-channel field effect transistor M14, and the gate voltage of the N-channel field effect transistor M14 is simultaneously changed. In accordance with the respective gate voltage changes of the channel field effect transistors M13 and M14, the potential of the output signal terminal 3 can quickly rise and fall. The operation of the remainder of this circuit is the same as that of the second embodiment shown in FIG. 2, and therefore, further explanation will be omitted.

In this fourth embodiment, the idling current flowing through the P-channel field effect transistor M13 and the N-channel field effect transistor M14 in the balanced condition is determined by a size ratio between the P-channel field effect transistors M11 and M13, a size ratio between the N-channel field effect transistors M18 and M12, and the current value of the constant current source I4.

In this fourth embodiment, it is possible to have a wide input range and a wide output range and to quicken the potential rising and the potential falling of the signal output terminal 3 in comparison with the prior art operational amplifier, without increasing the consumed current.

Figure 5:
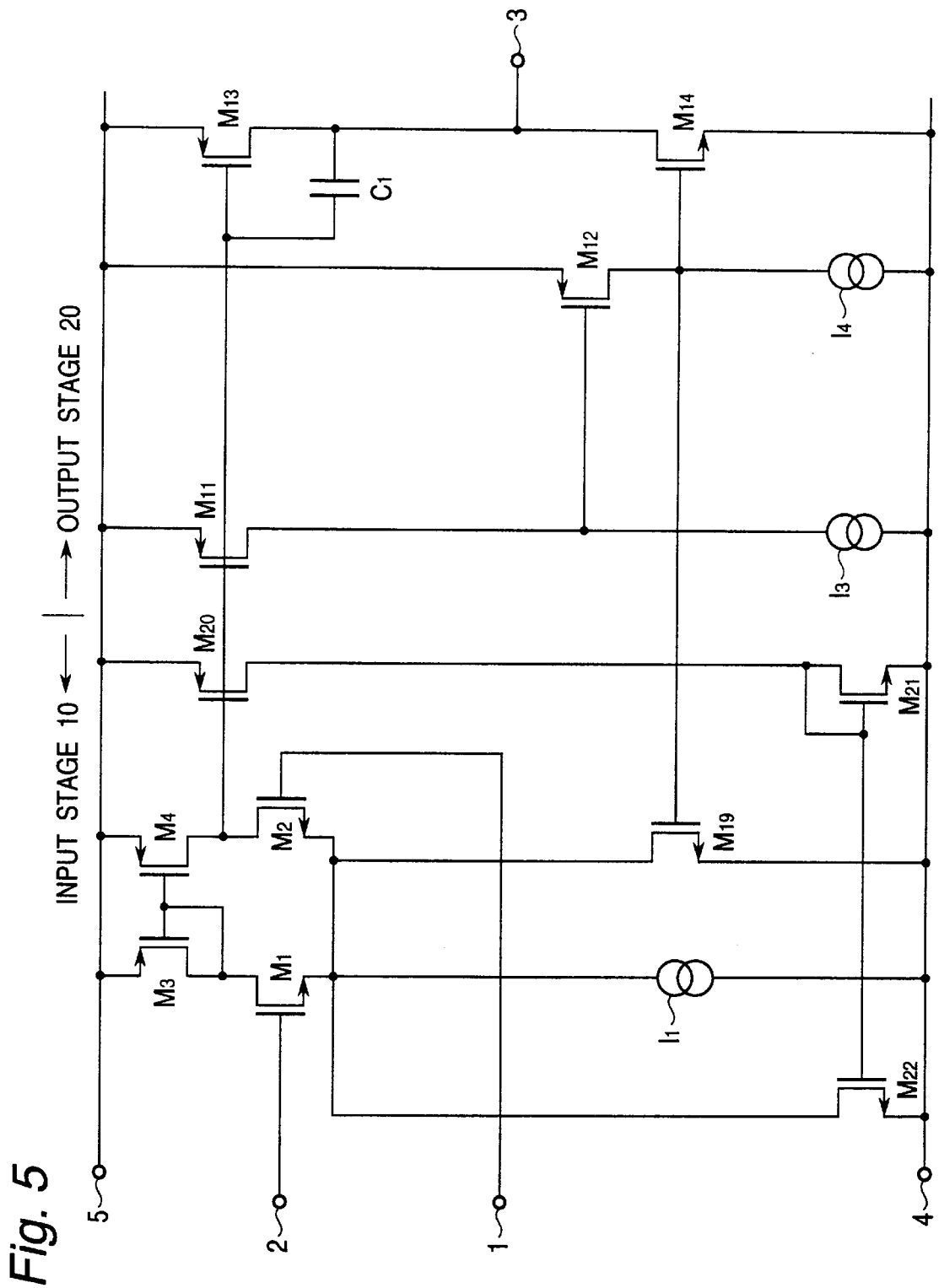
FIG. 5 is a circuit diagram of a fifth embodiment of the operational amplifier in accordance with the present invention.

Referring to FIG. 5, there is shown a circuit diagram of a fifth embodiment of the operational amplifier in accordance with the present invention. In FIG. 5, circuit elements corresponding to those shown in FIG. 1 are given the same reference numerals.

The fifth embodiment shown in FIG. 5 is generally divided into an input stage 10 connected to signal input terminals 1 and 2 for receiving and amplifying a signal between the signal input terminals 1 and 2 in a differential manner, an output stage 20 for driving an output signal terminal 3 for outputting a signal, and a capacitance C1 connected between an output node of the input stage 10 and the signal output terminal 3. The fifth embodiment is the same as the first embodiment excluding the first stage 10, and therefore, explanation of portions other than the first stage 10 will be omitted for simplification of description.

The input stage 10 of the fifth embodiment includes
a differential transistor pair composed of a pair of N-channel field effect transistors M1 and M2 having their sources connected to each other and their gates connected to the signal input terminals 2 and 1, respectively;

a first constant current source I1 connected between the common-connected sources of the N-channel field effect transistors M1 and M2 and a low potential power supply line 4;

a P-channel field effect transistor M3 having a gate and a drain connected in common to a drain of the N-channel field effect transistor M1 and a source connected to a high potential power supply line 5;

a P-channel field effect transistor M4 having a source connected to the high potential power supply line 5, a gate connected to the gate and the drain of the P-channel field effect transistor M3, and a drain connected to a drain of the N-channel field effect transistor M2;

a P-channel field effect transistor M19 connected in parallel to the first constant source I1 and having a gate connected to the gate of the N-channel field effect transistor M14 in the output stage 20, so as to selectively supply an additional bias current to the differential transistor pair composed of the N-channel field effect transistors M1 and M2, in addition to a bias current supplied by the first constant source I1, in accordance with the level-shifted signal applied to the gate of the N-channel field effect transistor M14 in the output stage 20;

a P-channel field effect transistor M20 having a source connected to the high potential power supply line 5, and a gate connected to the gates of the P-channel field effect transistors M11 and M13 in the output stage 20;

an N-channel field effect transistor M12 having a source connected to the low potential power supply line 4 and a gate and a drain connected to a drain of the P-channel field effect transistor M20; and an N-channel field effect transistor M22 having a source connected to the low potential power supply line 4, a gate connected to the gate and the drain of N-channel field effect transistor M21 to form a current mirror circuit, and a drain connected to the common-connected sources of the N-channel field effect transistors M1 and M2.

Namely, the N-channel field effect transistor M22 is connected in parallel to the first constant source I1.

Now, an operation of the fifth embodiment of the operational amplifier will be described.

The fifth embodiment of the operational amplifier includes the input stage composed of the differential transistor pair formed of the N-channel field effect transistors M1 and M2, and the drain of the N-channel field effect transistor M2 being connected to the output stage as an output of the input stage. In the output stage, the output of the input stage is connected to the gate of the P-channel field effect transistor M13 so as to change a gate voltage in accordance with the difference between signal voltages applied to the signal input terminals 1 and 2, and at the same time, the output of the input stage is level-shifted through the P-channel field effect transistor M11 and the P-channel field effect transistor M12, so that this level-shifted signal is applied to the gate of the N-channel field effect transistor M14 so as to simultaneously change the gate voltage of the N-channel field effect transistor M14. In accordance with the respective gate voltage changes of these field effect transistors M13 and M14, the potential of the output signal terminal 3 quickly elevates or drops.

This operation of the output stage is the same as the operation of the output stage of the prior art operational amplifier shown in FIG. 8, and therefore, the output stage can have a wide output range similarly to the prior art operational amplifier. An idling current flowing through the P-channel field effect transistor M13 and the N-channel field effect transistor M14 in a balanced condition, is determined by a size ratio between the P-channel field effect transistor M11 and the P-channel field effect transistor M13 and a current flowing through the constant current source I3.

In this embodiment, when the voltage applied to the signal input terminal 1 is higher than that applied to the signal input terminal 2, the output of the input stage 10 supplied from the drain of the field effect transistor M2 of the differential transistor pair becomes low; therefore, the gate voltage of the P-channel field effect transistors M11 and M13 of the output stage 20 becomes low, and simultaneously, the gate voltage of the P-channel field effect transistor M20 of the input stage 10 also becomes low. As a result, a current flowing through the P-channel field effect transistor M20 becomes very large, so that this enlarged current also flows through the N-channel field effect transistor M21. Since the N-channel field effect transistor M21 and the N-channel field effect transistor M22 are connected to form the current mirror circuit, a large current flows through the N-channel field effect transistor M22. Accordingly, in the equation $dV0/=K \cdot Ii/C$, the variable "Ii" becomes large, with the result that the slew rate becomes temporarily large.

On the other hand, when the voltage applied to the signal input terminal 1 is lower than that applied to the signal input terminal 2, the output of the input stage 10 supplied from the drain of the field effect transistor M2 of the differential transistor pair becomes high. In the output stage, therefore, the level shifted signal applied to the gate of the N-channel field effect transistor M14 becomes high, and simultaneously, the gate voltage of the P-channel field effect transistor M19 of the input stage 10 also becomes high. As a result, the N-channel field effect transistor M19 allows a large current to flow therethrough. Namely, the current flowing through the input stage 10 becomes large during only a falling period in which the potential of the output signal terminal 3 falls. Accordingly, in the equation $dV0/= K \cdot Ii/C$, the variable "Ii" becomes large, with the result that the slew rate becomes large temporarily.

As mentioned above, the fifth embodiment of the operational amplifier can have a wide output range and can quicken the potential rising and the potential falling of the signal output terminal 3 in comparison with the prior art operational amplifier, without increasing the consumed current.

The output stage of the fifth embodiment of the operational amplifier is the same as that of the first embodiment. Therefore, as modifications of the fifth embodiment, for example, the input stage of the fifth embodiment can be combined with the output stage of the second to fourth embodiments. These modifications can have a wide output range and can quicken the potential rising and the potential falling of the signal output terminal 3 in comparison with the prior art operational amplifier, without increasing the consumed current, similarly to the fifth embodiment.

Figure 6:
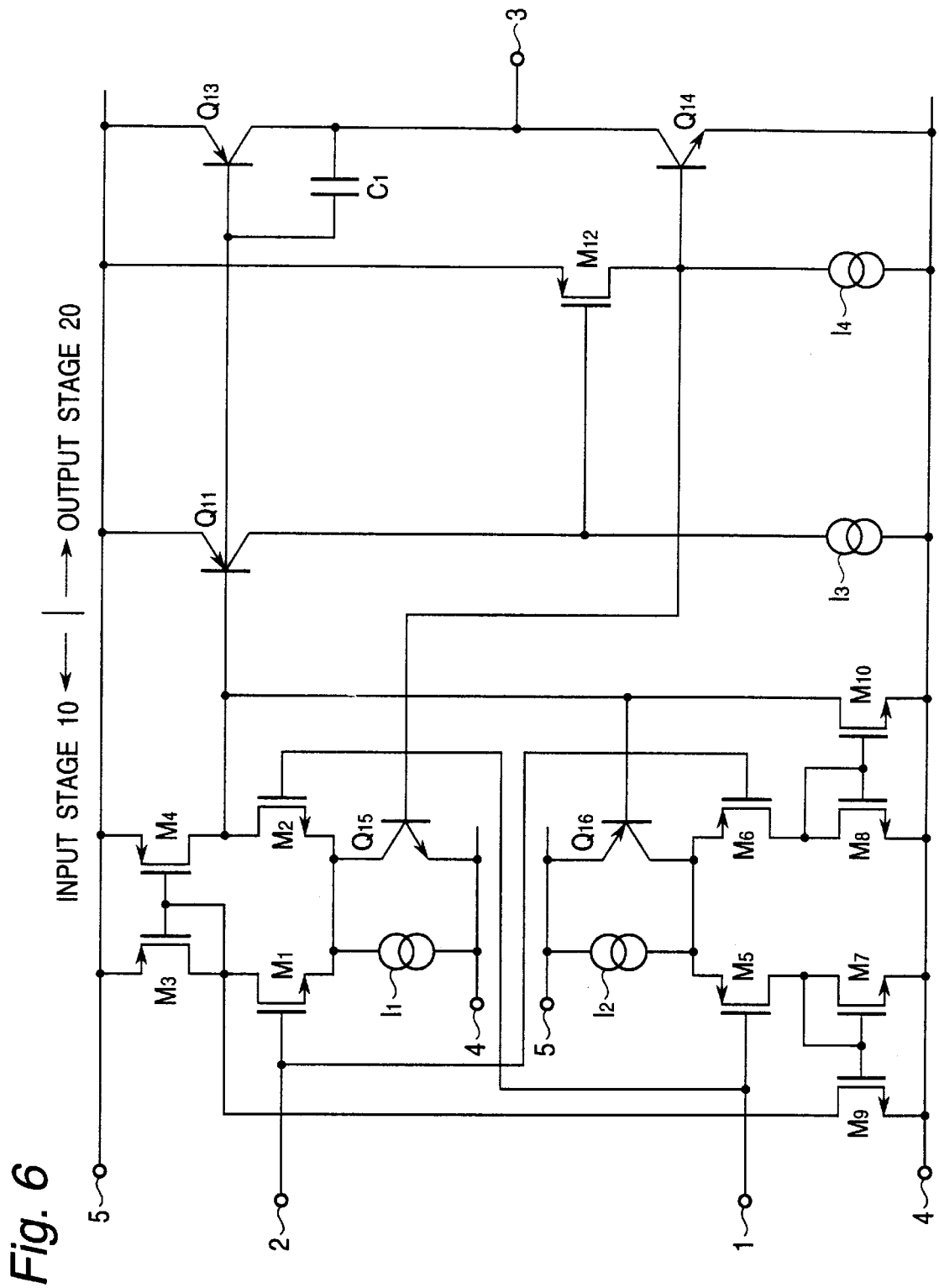
FIG. 6 is a circuit diagram of a sixth embodiment of the operational amplifier in accordance with the present invention.

Referring to FIG. 6, there is shown a circuit diagram of a sixth embodiment of the operational amplifier in accordance with the present invention. In FIG. 6, circuit elements corresponding to those shown in FIG. 1 are given the same reference numerals, and explanation will be omitted for simplification of description. In the following, a feature of the sixth embodiment differing from the first embodiment will be described.

As seen from comparison between FIG. 1 and FIG. 6, the sixth embodiment is different from the first embodiment only in that PNP bipolar transistors Q11, Q13 and Q16 are used in place of the P-channel field effect transistors M11, M13 and M16, respectively, and NPN bipolar transistors Q14 and Q15 are used in place of the N-channel field effect transistors M14 and M15, respectively.

Since there is no functional difference between an operational amplifier formed of field effect transistors and an operational amplifier formed of bipolar transistors, a basic operation of the sixth embodiment is the same as that of the first embodiment. In this construction of the sixth embodiment, on the other hand, since it is generally the case that a bipolar transistor has a mutual conductance larger than that of a field effect transistor, the rising time and the falling time of the signal on the output signal terminal 3 can be possibly shortened in comparison with the first embodiment.

The sixth embodiment of the operational amplifier is characterized in that in the bias current supplementing means of the input stage and in the output stage of the first embodiment, only the transistors having the control electrode receiving either the output of the input stage or the level-shifted signal of the output of the input stage are formed of bipolar transistors. Therefore, as modifications of the sixth embodiment, for example, in the bias current supplementing means of the input stage and in the output stage of the first to fifth embodiments, only the transistor having the control electrode receiving either the output of the input stage or the level-shifted signal of the output of the input stage are formed of bipolar transistors. These modifications can have an advantage similar to this sixth embodiment.

Figure 7:
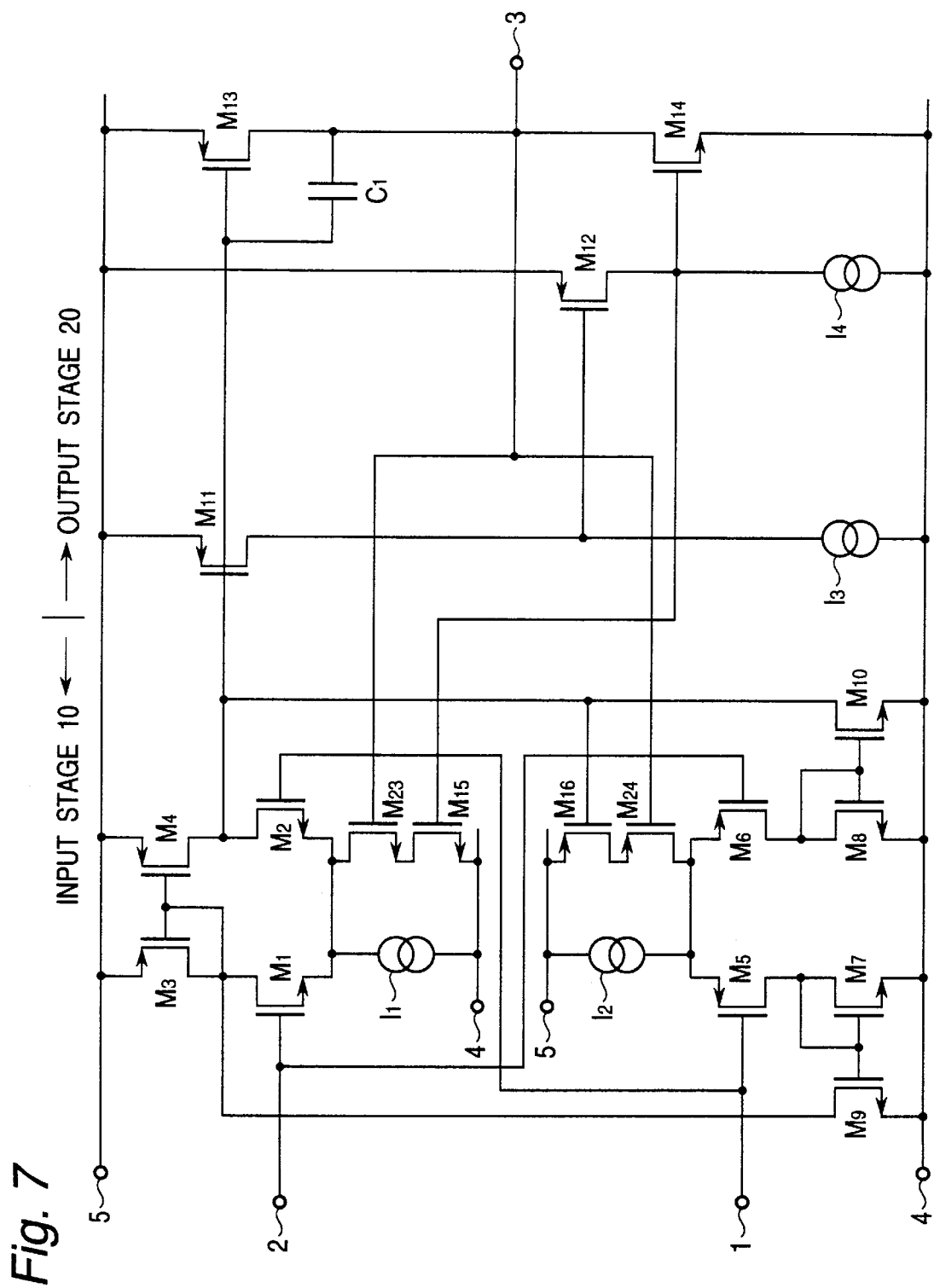
FIG. 7 is a circuit diagram of a seventh embodiment of the operational amplifier in accordance with the present invention.

Referring to FIG. 7, there is shown a circuit diagram of a seventh embodiment of the operational amplifier in accordance with the present invention. In FIG. 7, circuit elements corresponding to those shown in FIG. 1 are given the same reference numerals, and explanation will be of those omitted for simplification of description. In the following, a feature of the second embodiment differing from the first embodiment will be described.

As seen from comparison between FIG. 1 and FIG. 7, the seventh embodiment is different from the first embodiment only in that there are added an N-channel field effect transistor M23 and a P-channel field effect transistor M24 having their gates connected to the output signal terminal 3, and a series circuit formed of the N-channel field effect transistors M23 and M15 is connected in parallel to the first constant current source I1, and a series circuit formed of the P-channel field effect transistors M24 and M16 is connected in parallel to the second constant current source I2.

When the potential of the signal output terminal 3 is equal to the potential of the low potential power supply line 4 due to for example a succeeding circuit connected to the signal output terminal 3, the N-channel field being effect transistor M23 is in an OFF condition, and therefore, the series circuit formed of the N-channel field effect transistors M23 and M15 is deactivated. Otherwise, the series circuit formed of the N-channel field effect transistors M23 and M15 is in an activated condition capable of selectively supplying the additional bias current to the differential transistor pair formed of the N-channel field effect transistors M1 and M2, in accordance with the level-shifted signal applied to the gate of the N-channel field effect transistor M14 in the output stage.

When the potential of the signal output terminal 3 is equal to the potential of the high potential power supply line 5 for example because of any cause of a succeeding circuit connected to the signal output terminal 3, the P-channel field effect transistor M24 is in an OFF condition, and therefore, the series circuit formed of the P-channel field effect transistors M24 and M16 is deactivated. Otherwise, the series circuit formed of the P-channel field effect transistors M24 and M16 is in an activated condition capable of selectively supplying the additional bias current to the differential transistor pair formed of the P-channel field effect transistors M5 and M6, in accordance with the output of the input stage applied to the gate of the P-channel field effect transistor M13 in the output stage.

In the seventh embodiment of the operational amplifier, when the potential of the signal output terminal 3 is equal to the potential of the low potential power supply line 4 or the potential of the high potential power supply line 5, it is possible to prevent a pass-through current from flowing through each differential transistor pair and its associated bias current supplementing means in the input stage.

The seventh embodiment of the operational amplifier is characterized in that each of the bias current supplementing means formed of the field effect transistors N15 and M16, respectively, in the first embodiment, is replaced with the bias current supplementing means which is deactivated when the potential of the signal output terminal 3 is equal to the potential of the low potential power supply line 4 or the potential of the high potential power supply line 5. Therefore, as modifications of the seventh embodiment, each of the bias current supplementing means in the second to sixth embodiments can be replaced with the bias current supplementing means which is deactivated when the potential of the signal output terminal 3 is equal to the potential of the low potential power supply line 4 or the potential of the high potential power supply line 5. In these modifications, the advantage of the seventh embodiment can be obtained similarly.

As modifications of the above mentioned first to seventh embodiments, it is a matter of course to persons skilled in the art that a complementary circuit construction can be realized by inverting the conductivity of each transistor and the polarity of each constant current source, and the operational amplifier having the complementary circuit construction can obtain a similar advantage.

In the above mentioned first to seventh embodiments, the input stage is constituted of the differential transistor pair formed of the field effect transistors. However, it is also a matter of course to persons skilled in the art that the input stage can be constituted of a differential transistor pair formed of bipolar transistors, and in this modification, a similar advantage can be obtained.

As mentioned above, the operational amplifier in accordance with the present invention is characterized in that a bias current supplementing means for selectively supplying an additional bias current to a differential transistor pair is connected in parallel to a constant current source for the differential transistor pair, and is activated when the output of the operational amplifier changes. Thus, the operational amplifier can operate with a wide input range and a wide output range, and can quicken the rising time and the falling time of the output signal of the operational amplifier without increasing the consumed current. For example, if the bias current supplementing means is used which is capable of additionally supplying the bias current of the same current capacity as that of the constant current source, the slew rate of the output signal of the operational amplifier can be elevated to two times or more.

In addition, since the bias current supply means is connected in parallel to the constant current source, the bias current supply means can be adjusted independently of the constant current source, and therefore, the biasing current for the differential transistor pair in a balanced condition and the biasing current for the differential transistor pair in a signal changing condition can be designed independently of each other. Therefore, the circuit design can be made easy.

The invention has thus been shown and described with reference to specific embodiments. However, it should be noted that the present invention is in no way limited to the details of the illustrated structures, but changes and modifications may be made within the scope of the appended claims.

What is claimed is:

1. An operational amplifier including:
    an input stage having a first differential transistor pair composed of a pair of transistors connected between a first constant current source and two output nodes and having control electrodes connected to two signal input terminals, respectively, so that a signal applied between said two signal input terminals is amplified in a differential manner, and an output signal is obtained from a selected output node of said two output nodes;
    an output stage having two output transistors of different conductivity types, connected in series between two power supply terminals, a connection node between said two output transistors being connected to an output signal terminal, and a level shift circuit receiving said output signal of said input stage for generating a level-shifted signal of said output signal of said input stage; said output signal of said input stage and said level-shifted signal being applied to control electrodes of said two output transistors, respectively, so that said two output transistors drive said output signal terminal in a push-pull manner; and
    a capacitance between said selected output node of said input stage and said output signal terminal,
    said input stage including a first bias current supplementing means connected in parallel to said first constant current source, for selectively supplying an additional bias current to said first differential transistor pair in accordance with said level-shifted signal.

2. An operational amplifier claimed in claim 1, wherein said input stage further includes
    a second constant current source having a polarity opposite to that of said first constant current source;
    two current mirror circuits having outputs connected to said two output nodes of said input stage, respectively;
    a second differential transistor pair composed of two transistors which are of the opposite conductivity type to that of said two transistors of said first differential transistor pair and which are connected between respective inputs of said two current mirror circuits and said second constant current source, wherein control electrodes of said two transistors of said second differential transistor pair are connected to said two signal input terminals, respectively, so that said signal applied between said two signal input terminals is amplified in a differential manner; and
    a second bias current supplementing means connected in parallel to said second constant current source, for selectively supplying an additional bias current to said second differential transistor pair in accordance with said output signal of said input stage, independently of the additional bias current supplied to the first differential transistor pair.

3. An operational amplifier claimed in claim 1, wherein said first bias current supplementing means is deactivated when a potential of said signal output terminal is substantially equal to a potential of one of said power supply terminals.

4. An operational amplifier claimed in claim 1, wherein said first bias current supplementing means includes a transistor connected in parallel to said first constant current source and has a control electrode connected to receive said level-shifted signal.

5. An operational amplifier claimed in claim 1, wherein said first bias current supplementing means further includes a current mirror circuit receiving a current changing in accordance with said level-shifted signal, for supplying a second additional bias current in parallel to said first constant current source.

6. An operational amplifier claimed in claim 1, wherein in said output stage and in said first bias current supplementing means, only transistors having a control electrode receiving said output signal of said input stage or said level-shifted signal are all formed of a field effect transistor or a bipolar transistor.

7. An operational amplifier claimed in claim 2, wherein each of said first and second bias current supplementing means is deactivated when a potential of said signal output terminal is substantially equal to a potential of one of said power supply terminals.

8. An operational amplifier claimed in claim 2, wherein said first and second bias current supplementing means include transistors connected in parallel to said first and second constant current sources, respectively, and having a control electrode connected to receive one of said output signal of said input stage and said level-shifted signal.

9. An operational amplifier claimed in claim 2, wherein at least one of said first and second bias current supplementing means further includes a current mirror circuit receiving a current changing in accordance with one of said output signal of said input stage and said level-shifted signal, for supplying a second additional bias current in parallel to said constant current source.

10. An operational amplifier claimed in claim 2, wherein in said output stage and in said first and second bias current supplementing means, only transistors having a control electrode receiving said output signal of said input stage or said level-shifted signal are all formed of a field effect transistor or a bipolar transistor.

* * * * *